(12) United States Patent
Tezuka et al.

(10) Patent No.: US 7,307,432 B2
(45) Date of Patent: Dec. 11, 2007

(54) ELECTRON BEAM GENERATING APPARATUS AND OPTICAL SAMPLING APPARATUS USING THE SAME

(75) Inventors: Kentaro Tezuka, Musashino (JP);
Tsuyoshi Yakihara, Musashino (JP);
Sadaharu Oka, Musashino (JP); Shinji Kobayashi, Musashino (JP); Akira Miura, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 11/001,351

(22) Filed: Dec. 1, 2004

(65) Prior Publication Data
US 2005/0134297 A1    Jun. 23, 2005

(30) Foreign Application Priority Data
Dec. 2, 2003 (JP) ............................ P2003-402564

(51) Int. Cl.
*G01R 31/305* (2006.01)
(52) U.S. Cl. .................................... 324/751
(58) Field of Classification Search ............... None
See application file for complete search history.

(56) References Cited

U.S. PATENT DOCUMENTS

| | | | | |
|---|---|---|---|---|
| 3,564,126 A | * | 2/1971 | Koch et al. | 348/61 |
| 3,868,541 A | * | 2/1975 | Van Zuijlen et al. | 315/94 |
| 4,158,210 A | * | 6/1979 | Watanabe et al. | 313/422 |
| 4,792,721 A | * | 12/1988 | Oku et al. | 313/432 |
| 5,157,303 A | * | 10/1992 | Polaert | 315/410 |
| 5,202,609 A | * | 4/1993 | Tomii et al. | 313/422 |
| 6,258,121 B1 | * | 7/2001 | Yang et al. | 427/2.21 |
| 6,463,124 B1 | * | 10/2002 | Weisman et al. | 378/136 |
| 6,737,792 B2 | * | 5/2004 | Saito et al. | 313/310 |
| 6,801,002 B2 | * | 10/2004 | Victor et al. | 315/169.3 |
| 2001/0005112 A1 | * | 6/2001 | Saito et al. | 313/311 |
| 2002/0027440 A1 | * | 3/2002 | Shinada et al. | 324/751 |
| 2002/0047637 A1 | * | 4/2002 | Victor | 315/294 |
| 2003/0155522 A1 | * | 8/2003 | Ooae et al. | 250/423 R |

FOREIGN PATENT DOCUMENTS

| | | | |
|---|---|---|---|
| JP | 59132546 A | * | 7/1984 |
| JP | 61242487 A | * | 10/1986 |
| JP | 63-269440 A | | 11/1988 |
| JP | 4-152229 A | | 5/1992 |
| JP | 04179033 A | * | 6/1992 |
| JP | 4-262213 A | | 9/1992 |
| JP | 4297836 | | 10/1992 |
| JP | 2000-173446 A | | 6/2000 |
| JP | 2003057118 | | 2/2003 |

\* cited by examiner

*Primary Examiner*—Jermele Hollington
(74) *Attorney, Agent, or Firm*—Sughrue Mion Pllc.

(57) ABSTRACT

An optical sampling apparatus has an electron beam generating apparatus which generates an electron beam by irradiating a cathode with an optical signal, a deflection electrode which deflects the generated electron beam, a sampling slit which transmits a part of the deflected electron beam, and a charge detection section which detects the quantity of charges or accumulated current of the transmitted electron beam. It is possible to perform accurate sampling in a high band.

4 Claims, 3 Drawing Sheets

US 7,307,432 B2

ELECTRON BEAM GENERATING APPARATUS AND OPTICAL SAMPLING APPARATUS USING THE SAME

BACKGROUND OF THE INVENTION

1. Field of the Invention

The present invention relates to an electron beam generating apparatus and an optical sampling apparatus for sampling the waveform of an electron beam generated by the electron beam generating apparatus.

2. Description of the Related Art

JP-A-H4-297836 and JP-A-2003-57118 disclose an optical sampling.

JP-A-H4-297836 discloses an apparatus that includes an electron tube having sensitivity with which one photoelectron is released in response to absorption of one photon within a predetermined wavelength range, and a pulse light source for generating sampling light pulses in a predetermined wavelength out of the predetermined wavelength range. As soon as light to be measured and a sampling light pulse enter together onto a photoelectric surface of the electron tube, one photoelectron is released from the photoelectric surface in accordance with the multiphoton absorption JP-A-2003-57118 discloses an apparatus that includes a photo-detector for converting an incident high-frequency light signal to be measured, into a high-frequency electric signal, a photoconductive switch for receiving a light pulse signal, and an electrode connecting the photo-detector and the photoconductive switch with each other, so as to sample the high-frequency electric signal by means of the light pulse signal incident on the photoconductive switch, and output an output signal.

In addition, the electrode is designed so that the high-frequency light signal to be measured and the light pulse signal have no interference with each other, and so that the size of the electrode is shorter than the size long enough to produce a waveform distortion in the output signal due to a reflected wave in the electrode.

FIG. 1 is a main portion configuration view of an optical sampling apparatus generally used in the prior art.

In FIG. 1, an optical signal 1 is converted into an electric signal by a photoelectric conversion element 2 such as a photo-detector, and the electric signal is sampled by an electrical sampler 3, and displayed on an oscilloscope 4.

SUMMARY OF THE INVENTION

However, in order to process a super-high frequency electric signal in an electric circuit (element), accurate measurement is difficult due to significant influence of parasitic capacitance, inductance or the like.

The object of the present invention is to provide an optical sampling apparatus in which an optical signal converted into an electron beam is sampled without handling any electric signal in any electric circuit (element), so that accurate sampling can be achieved in a high band.

DETAILED DESCRIPTION OF THE PREFERRED EMBODIMENTS

Figure 1:
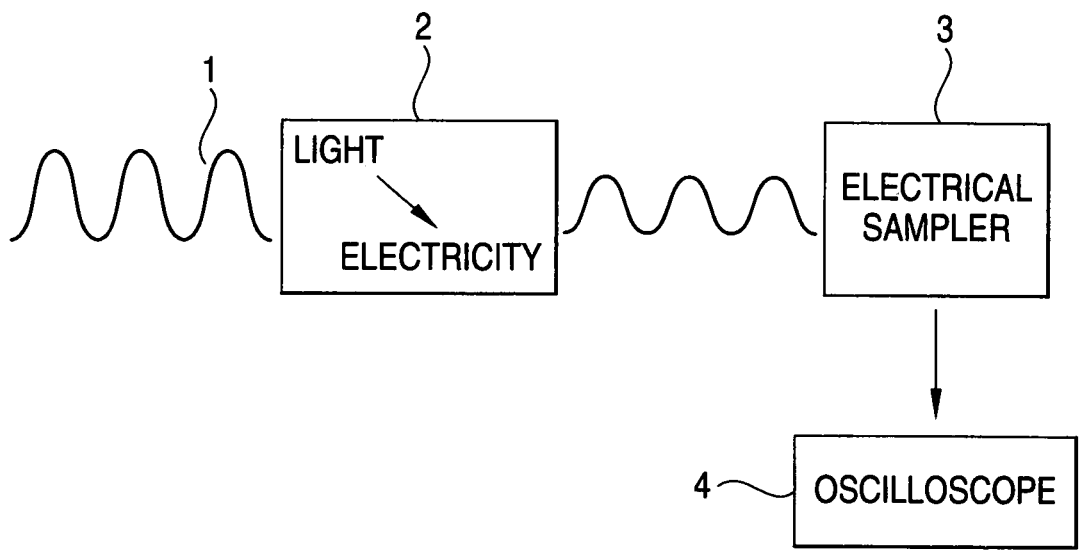
FIG. 1 is a block configuration view showing an optical sampling apparatus in the prior art.
Figure 2:
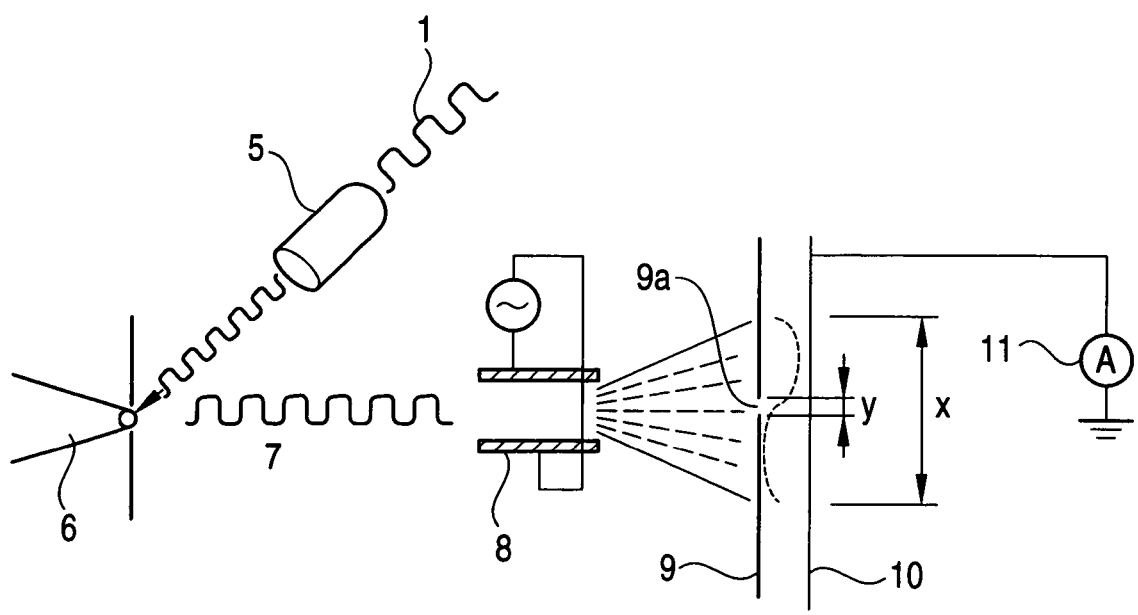
FIG. 2 is a configuration view showing an embodiment of an electron beam generating apparatus and an optical sampling apparatus using the electron beam generating apparatus according to the invention.

The invention will be described below in detail with reference to the drawings. FIG. 2 is a configuration view showing a main portion of an optical sampling apparatus according to the invention.

In FIG. 2, an optical signal 1 is narrowed by a lens 5, and a cathode 6 made of carbon nanotubes (CNT) is irradiated with the narrowed optical signal 1. As a result, an electron beam 7 reflecting the optical signal is emitted from the cathode 6 irradiated with the optical signal. That is, an electric current of an electron beam changes in accordance with the optical signal.

The deflection of the emitted electron beam 7 is regulated by a deflection electrode 8 so that, for example, a deflected irradiation width X in one cycle is about several millimeters. In addition to carbon nanotubes, tungsten filament (W), lanthanum hexaboride ($LaB_6$), silicon (Si), etc. may be used as the material of the cathode.

A sampling slit 9a having a width of about 10 μm by way of example is formed in a plate 9. A part of the electron beam 7 passes through the slit 9a. The electron beam passing through the slit 9a is captured by an electrode 10 and detected by an ammeter (or ampere-hour meter) 11.

Figure 3:
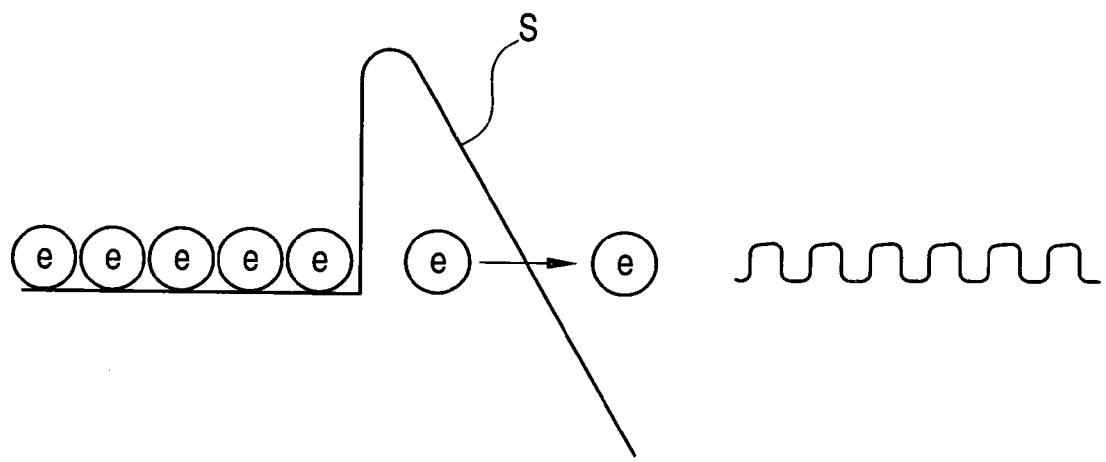
FIG. 3 is a view showing the behavior of an electron due to a tunnel effect when a cathode is irradiated with light.

Here, with reference to FIG. 3, description will be made about the behavior of light narrowed by the lens 5 and applied to the cathode 6.

Any electron "e" in an electrically conductive band lies in a state called a Fermi level no matter whether the conductive band is metal or semiconductor. When the electron "e" is irradiated with light energy in this state, the kinetic energy of the electron increases to move to a higher level. Thus, there is apt to occur a tunnel effect that the electron jumps over a disturbance build "S". By use of this phenomenon, the cathode is irradiated with an optical signal so as to release an electron beam reflecting the optical signal.

Figure 4:
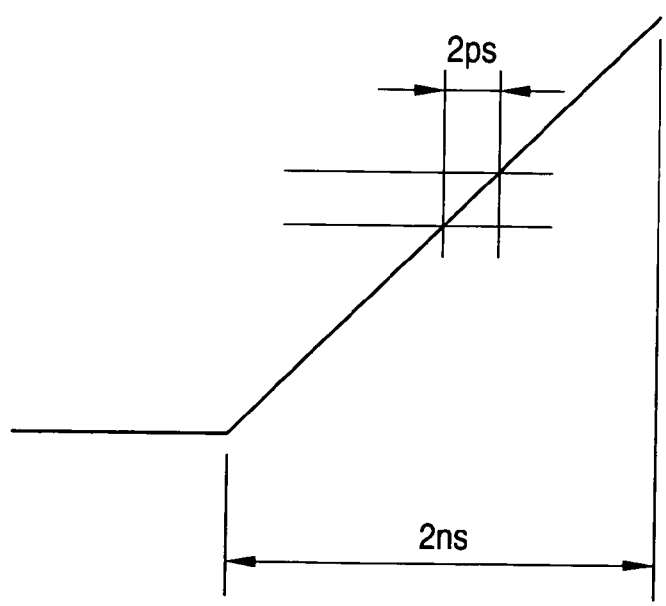
FIG. 4 is an explanatory view showing that high-speed operation can be achieved due to the relationship between a deflection electrode and a slit.

FIG. 4 shows a detectable frequency band when the deflection electrode is operated at 2 ns (nanoseconds) with a sampling slit width "y" of 10 μm and a deflected sweep width of 10 mm.

That is:

$$10 \text{ μm}/10 \text{ mm} = 1/1000$$

$$2 \text{ ns} \times 1/1000 = 2$$

therefore, $fc = 1/2\pi \times 2 \text{ ps} = 80$ GHz

Thus, when the deflection electrode is operated in the aforementioned conditions, a band of 80 GHz can be created.

Figure 5:
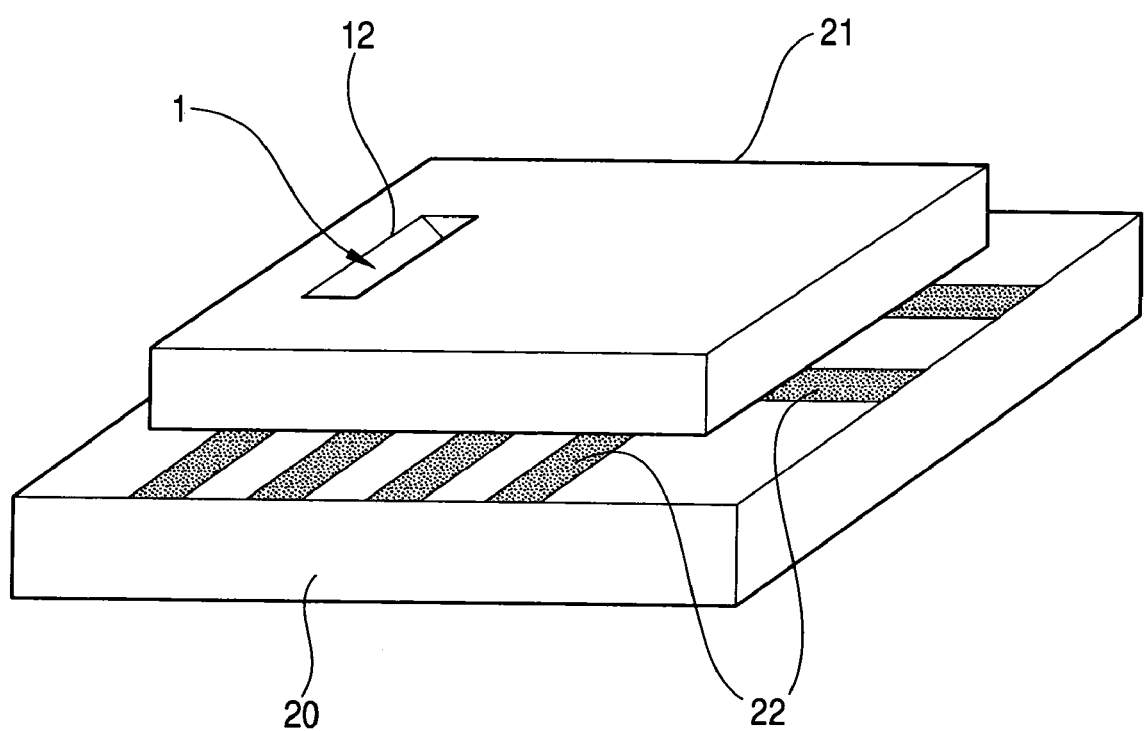
FIG. 5 is a perspective view showing the state where the optical sampling apparatus has been packaged.

Incidentally, a wider band or a higher speed can be achieved by changing the mechanical size of the sampling slit width (y) or the deflected irradiation width or increasing the operating frequency of the deflection FIG. 5 shows a state where the optical sampling apparatus shown in FIG. 2 has been packaged.

In FIG. 5, a rectangular second substrate 21 having a smaller area than a rectangular first substrate 20 is fixed to one surface of the first substrate 20. A recess portion (not shown) is formed in at least one of the substrates 20 and 21 in the portion where the substrates 20 and 21 are put on top of each other. The cathode 6, the deflection electrode 8, the plate 9, the sampling slit 9a, the electrode 10, etc. shown in FIG. 2 are received in the recess portion.

The reference numeral 22 represents a pad provided in a free space of the first substrate 20. The pad 22 serves to apply a voltage to the deflection electrode 8 shown in FIG. 2 or extract an electric signal from the electrode 10 shown in FIG. 2. An optical window 12 for introducing a optical signal is formed near a side edge portion of the second substrate 21. The window is air-tightly sealed with a transparent piece so that the cathode 6, the deflection electrode 8, the plate 9, the sampling slit 9a, the electrode 10, etc. shown in FIG. 2 and received between the substrates put on top of each other are disposed in a vacuum so as to serve as an optical sampling apparatus.

The optical sampling apparatus shown in FIG. 2 is received thus in a vacuum package configured as shown in received thus in a vacuum package configured as shown in FIG. 5. In such a manner, a high-band optical sampling IC can be obtained. That is, since no I/O of a high-frequency electric signal is required, any hermetic casing having any shape can be used if it has an optical window.

According to the invention, a cathode is irradiated with an optical signal so as to obtain an electron beam reflecting the optical signal. Accordingly, light to electron beam conversion can be achieved so that accurate sampling can be performed in a high band.

In addition, the cathode irradiated with an optical signal generates an electron beam due to a tunnel effect. Thus, the speed is accelerated.

Further, there are provided a cathode for generating an electron beam in accordance with an optical signal applied to the cathode, a deflection electrode for deflecting the generated electron beam, a sampling slit for transmitting a part of the deflected electron beam, and a charge detection section for detecting the quantity of charges (or accumulated current) of the transmitted electron beam. The cathode, the deflection electrode and the sampling slit are disposed in a recess portion formed in at least one of first and second substrates. The first and second substrates are brought into tight contact with each other so that the cathode, the deflection electrode and the sampling slit are sealed in the recess portion under vacuum with the first and second substrates. Thus, a high-band optical sampling IC can be obtained.

The above description merely shows a specific preferred embodiment in order to illustrate and exemplify the invention. For example, the shapes of the substrates or the material of the cathode is not limited to that in the embodiment, but may be changed suitably. Accordingly, the invention is not limited to the aforementioned embodiment, but includes various changes or modifications without departing from the gist of the invention.

What is claimed is:

1. An optical sampling apparatus comprising:
   a cathode for generating an electron beam in accordance with an optical signal applied to the cathode;
   a deflection electrode for deflecting the generated electron beam;
   a sampling slit for transmitting a part of the deflected electron beam; and
   a charge detection section that detects a quantity of charges or accumulated current of the transmitted electron beam, further comprising:
   a first substrate and a second substrates that are brought into tight contact with each other,
   wherein the cathode, the deflection electrode and the sampling slit are disposed in a recess portion formed in at least one of the first and second substrates and are sealed in the recess portion under vacuum with the first and second substrates.

2. The optical sampling generating apparatus according to claim 1,
   wherein an optical window is formed near a side edge portion of the second substrate, and wherein said optical beam is irradiated onto said cathode through the window.

3. An electron beam generating apparatus comprising:
   a source of an optical signal,
   a cathode irradiated with said optical signal,
   wherein the cathode generates said electron beam in accordance with the optical signal, wherein the cathode is disposed within a package having a window, and
   wherein said optical beam is irradiated onto said cathode through the window.

4. The electron beam generating apparatus according to claim 3, wherein the cathode comprises a carbon nanotube.

* * * * *